United States Patent
Kraft

(10) Patent No.: US 7,119,006 B2
(45) Date of Patent: Oct. 10, 2006

(54) VIA FORMATION FOR DAMASCENE METAL CONDUCTORS IN AN INTEGRATED CIRCUIT

(75) Inventor: Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 132 days.

(21) Appl. No.: 10/304,943

(22) Filed: Nov. 26, 2002

(65) Prior Publication Data

US 2004/0100779 A1 May 27, 2004

(51) Int. Cl.
*H01L 21/4763* (2006.01)

(52) U.S. Cl. ............... 438/622; 438/637; 438/704; 438/705; 438/723; 438/724; 438/725; 438/740; 438/743; 438/744; 438/751; 438/756; 438/757; 257/E21.579

(58) Field of Classification Search ............... 438/622, 438/637, 704, 705, 723–725, 740, 743, 744, 438/751, 756, 757; 257/E21.579
See application file for complete search history.

(56) References Cited

U.S. PATENT DOCUMENTS

| | | | |
|---|---|---|---|
| 5,741,626 A * | 4/1998 | Jain et al. .............. | 430/314 |
| 6,054,384 A | 4/2000 | Wang et al. | |
| 6,127,258 A | 10/2000 | Watanabe et al. | |
| 6,362,093 B1 * | 3/2002 | Jang et al. .............. | 438/633 |
| 6,380,096 B1 * | 4/2002 | Hung et al. .............. | 438/723 |
| 6,410,426 B1 | 6/2002 | Xing et al. | |
| 6,448,176 B1 * | 9/2002 | Grill et al. .............. | 438/637 |
| 6,465,340 B1 | 10/2002 | Wang et al. | |
| 6,583,047 B1 * | 6/2003 | Daniels et al. .............. | 438/623 |
| 2002/0187627 A1 * | 12/2002 | Yuang .............. | 438/622 |
| 2003/0040172 A1 * | 2/2003 | Brennan .............. | 438/622 |

* cited by examiner

*Primary Examiner*—Matthew Smith
*Assistant Examiner*—Thanh V. Pham
(74) *Attorney, Agent, or Firm*—Jacqueline J. Garner; Wade James Brady, III; Frederick J. Telecky, Jr.

(57) ABSTRACT

A method of fabricating an integrated circuit, having copper metallization formed by a dual damascene process, is disclosed. A layered insulator structure is formed over a first conductor (22), within which a second conductor (40) is formed to contact the first conductor. The layered insulator structure includes a via etch stop layer (24), an interlevel dielectric layer (26), a trench etch stop layer (28), an intermetal dielectric layer (30), and a hardmask layer (32). The interlevel dielectric layer (26) and the intermetal dielectric layer (30) are preferably of the same material. A via is partially etched through the intermetal dielectric layer (30), and through an optional trench etch stop layer (28). A trench location is then defined by photoresist (38), and this trench location is transferred to the hardmask layer (32). Simultaneous etching of the trench through intermetal dielectric layer (30), stopping on the trench etch stop layer (28) if present, simultaneously with the etching of the remainder of the via through the interlevel dielectric layer (26) that stops on the via etch stop layer (24), is then performed. After clearing the via etch stop layer (24) from the via bottom, a copper conductor (40) is then formed into the trench and via, for example by electroplating and planarization by chemical mechanical polishing over a barrier layer (41).

11 Claims, 6 Drawing Sheets

FIG. 3
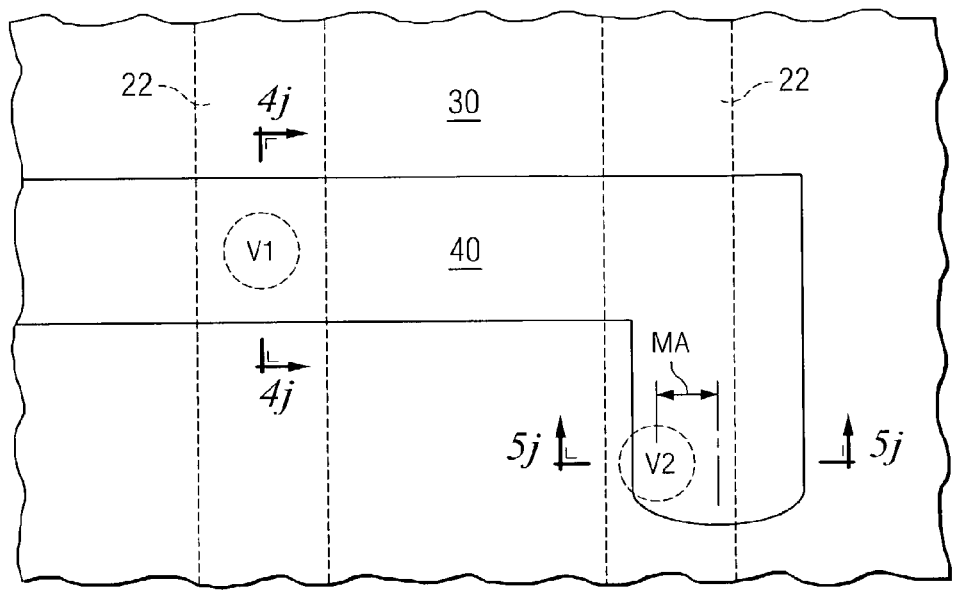
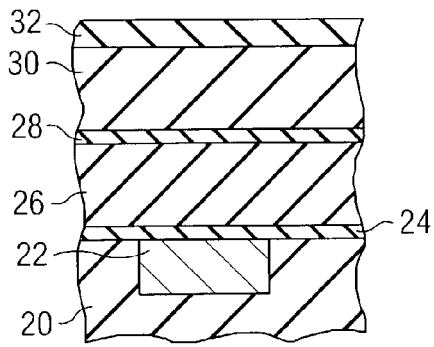
FIG. 4a
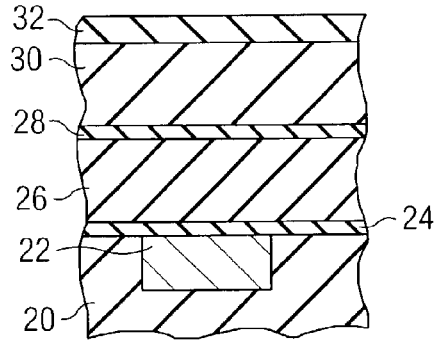
FIG. 5a
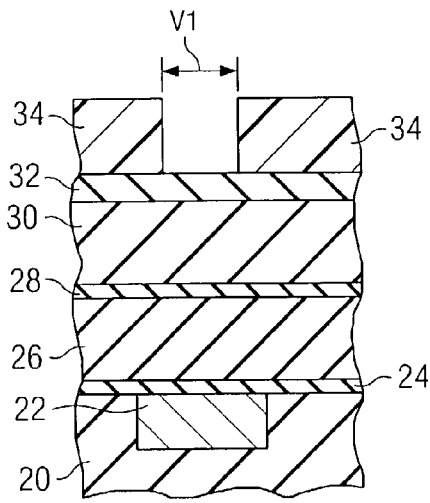
FIG. 4b
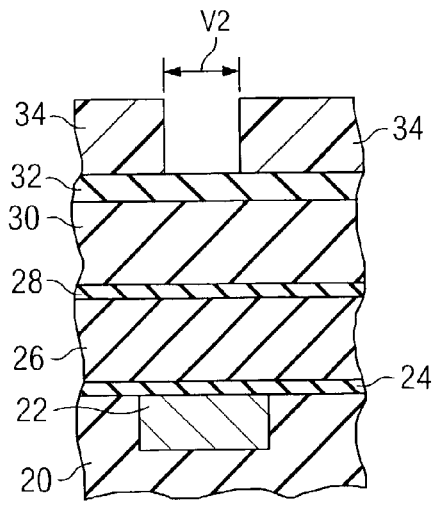
FIG. 5b

VIA FORMATION FOR DAMASCENE METAL CONDUCTORS IN AN INTEGRATED CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacturing, and is more specifically directed to the formation of metal conductors in modern integrated circuits.

In the field of integrated circuit manufacturing, a fundamental goal to design and manufacture integrated circuits to be as small as possible. As is well known in this art, the manufacturing cost of an integrated circuit corresponds strongly to the wafer area occupied by each integrated circuit die or chip. This is because the chip area correlates directly to the number of possible integrated circuits per manufactured wafer, and because the theoretical yield, for a given manufacturing defect density, increases as chip area decreases. In addition, the smaller feature sizes that result in decreasing chip area also provide improved device performance and increased functionality per unit area.

An important advance that has reduced the necessary chip area for modern integrated circuits is the technology for forming multiple levels of metal conductors. Increases in the number of available metal levels has provided dramatic reduction in chip area and in device and functionality density.

Of course, the implementation of multiple metal levels presents many challenges and tradeoffs. The cross-sectional area of each metal conductor is preferably minimized, especially in the lower levels, to permit overlying levels to make vertical connections, or contacts, to lower metal levels and to the underlying active devices. These narrower-pitch metal lines require high resolution photolithography. In addition, current density increases as the cross-sectional area of the conductors decrease, which increases the vulnerability of the finished conductors to electromigration. It is also desirable to make the dielectric insulating layers between adjacent metal levels as thin as possible, to facilitate the making of contacts from upper metal levels to underlying metal levels and active devices. These factors affect the selection of materials and fabrication methods for modern integrated circuit metallization.

Copper has become a popular metallization material in modern integrated circuits, replacing aluminum metallization in many instances. Copper is significantly more conductive than aluminum, and is also less vulnerable to electromigration failure than is aluminum. Damascene processes are often used to form multiple levels of copper conductors. In general, damascene processes refer to the inlaying of copper (or another metal) into grooves or trenches that are etched into an insulator to define the conductor lines. In contrast, traditional metallization is formed by the depositing of a film of metal over insulating films on the wafer surface, followed by the patterned etching of the metal film to define the conductors.

In general, dual damascene copper metal processes refer to metallization systems in which the deposited metal fills both trenches and vias in the etched insulator layer. Vias correspond to the locations at which the copper metal will make contact to an underlying feature, and as such vias are etched completely through the insulator layer. Trenches correspond to the locations of copper conductor runs, and as such trenches only partially extend into the insulator layer. Some processes are referred to as "trench first", in which case the trenches are etched into the insulator before the vias are etched, while other processes are referred to as "via first", because the vias are defined prior to trench etch. In either case, copper metal is deposited, typically by electrochemical deposition (e.g., electroplating), over the surface of the wafer and into the trenches and vias. In some processes (i.e., single damascene processes), a conductive plug of tungsten or polysilicon is formed into the vias before copper deposition. Chemical-mechanical polishing (CMP) is then performed to remove excess copper from the surface of the insulator, leaving the copper conductor inlaid within the trenches and vias. An insulator layer is then deposited over the structure, to insulate the newly-formed copper conductors from conductors in the next metal level.

In conventional dual damascene processing, trenches are coincident with vias, so that the single deposition of metal both forms the conductors and contacts a conductor in a previous, or lower, level. Because the exposures of the trench and via patterns are separate and independent from one another, in either the trench-first or via-first processes, misalignment of the trench pattern relative to the via pattern can often occur. The risk and extent of this misalignment is heightened for those levels in which the vias are being formed to the process limits, in order to attain maximum device density.

FIGS. 1a and 1b illustrate a conventional dual damascene process, and the effects of misalignment between trenches and vias. This process is similar to that described in U.S. Pat. No. 6,410,426, assigned to Texas Instruments Incorporated and incorporated herein by this reference. In this example, lower level conductor 2 is a metal or other conductive structure disposed within insulator film 1, and overlying active structures (not shown) in the device. According to this example, an overlying copper metallization element (not shown), formed according to a dual damascene process and thus disposed in a trench in insulating film 4, is to make connection to conductor 2 through a via that is formed through insulating film 4. Etch stop layer 3 is disposed at the surface of insulating film 1 and conductor 2. Insulating film 4, for example a low dielectric constant insulator, is disposed over etch stop layer 3, and is capped by cap layer 5, which is silicon carbide, tantalum nitride or another similar material for protecting insulating film 4 from the harsh etches used to form vias and trenches there through.

As shown in FIG. 1a, via V has been etched through insulating film 4, at a location defined by photolithography in the conventional manner. This via V extends to etch stop layer 3, which is resistant to etching by the reagent used to etch insulating film 4. At the state shown in FIG. 1a, photoresist pattern 8, with the assistance of bottom anti-reflective coating layer 6, has been photolithographically patterned to define the location of trench opening T, overlying the location of via V so that the conductor to be formed in the eventual trench contacts underlying conductor 2 through via V. However, as shown in FIG. 1a, the pattern of trench opening T is misaligned relative to via V, with photoresist 8 overlapping into via V. If trench opening T through photoresist 8 were perfectly aligned to via V, trench opening T would be centered and symmetric about via V. The misalignment of via V and trench opening T through photoresist 8 is shown in plan view in FIG. 1b. In addition, whether misaligned or not, BARC filament 7 will be present at the bottom of via V, as BARC layer 6 is dispensed after via formation. BARC filament 7 protects etch stop layer 3, at the bottom of via V, during the etching of the trench into insulating film 4.

Several manufacturing problems are endemic to conventional processes of this type. As evident from FIG. 1a and as mentioned above, BARC filament 7 is disposed within via V. Because of the depth of via V, the full extent of which has been formed through insulating film 4 at this point in the process, the top surface of BARC filament 7 will be some distance below the level of BARC layer 6 over insulating film 4 and cap dielectric 5. Considering today's high resolution photolithography processes and equipment, and the very short wavelengths used in this photo-exposure, it is believed, in connection with this invention, that the photolithography of trench opening T is made quite difficult by this differential height of BARC filament 7 relative to BARC layer 6. Because BARC layer 6 is spun-on, it thins at the edges of via V, resulting in non-optimal thickness and thus degraded anti-reflective properties at the edges of via V. This in turn reduces the fidelity of the photoresist pattern at trench location T. In addition, the depth of vias V exacerbates the natural thinning of photoresist 8 at locations where the via density is high; if photoresist 8 thins too much, it may not survive the trench etch process. For these reasons, it is contemplated that the proper exposure of photoresist 8 at the location of trench opening will be compromised in this conventional process, especially in the manufacture of modern high performance integrated circuits with small feature sizes and high via densities. As such, many modern via-first damascene processes, similar to that shown in FIGS. 1a and 1b, avoid the use of BARC layer 6 to avoid this very problem. This comes at a cost of suboptimal photolithographic results relative to that which can be achieved through the use of a BARC layer, resulting from reflection fringes, standing wave effects, and the like caused by reflection of the exposing light from the surface of cap layer 5 and etch stop layer 3.

By way of further background, other conventional dual damascene trench-via processes use an intermediate etch stop layer to define the depth of the trench in a trench-via dual damascene process. An example of such a process is described in U.S. Pat. No. 6,054,384. It has been observed, in connection with this invention, that misalignment of the trench pattern relative to the underlying via pattern in these conventional processes not only causes difficulty with the photolithography of the trench pattern, but also reduces the width of the via itself. Reduction in via width can result in poor conductivity between metal levels, and in extreme cases can result in voids or opens in the metal deposited into the via.

FIGS. 2a through 2d illustrate this reduction in via width, due to such misalignment in a conventional dual damascene process. Structure 10 may be an underlying conductor, such as a lower level copper conductor disposed in a trench. In this example, masking layer 11 (e.g., a silicon nitride) is disposed over structure 10, and insulating layer 12 is disposed over masking layer 11. Masking layer 13 is disposed over insulating layer 12, and has been photolithographically patterned and etched to have via opening V thereat; via opening V defines the location of a via through insulating layer 12, as will become apparent from the following description.

Following the opening of via opening V in masking layer 13, insulating layer 14 is then disposed overall. In similar fashion as before, masking layer 15 is disposed over insulating layer 14, and trench opening T is etched through masking layer 15 at trench location T, which is defined by photolithographically patterned photoresist 16. In this example, however, the patterning of trench opening in photoresist 16 (and thus in mask layer 15) is misaligned relative to via opening V, as shown in FIG. 2a. The misalignment of this example is sufficiently severe that trench opening T does not entirely overlie via opening V in masking layer 13. This is not an uncommon situation, especially as the dimensions of via opening V and trench opening T are pushed to their process limits for this level.

FIG. 2b illustrates the structure following the removal of photoresist 15, after trench opening T is formed in masking layer 15. The structure is then subjected to an etch, removing the exposed portions of insulating layer 14 and insulating layer 12. For minimum size features, this etch is preferably an anisotropic etch that is selective to insulating layers 14, 12 relative to masking layers 15, 13, and to masking layer 11 (serving as an etch stop at the bottom of the via); in this way, trench opening T in masking layer 15 and via opening V in masking layer 13 define the locations at which insulating layers 14, 12, respectively are etched. The resulting structure after this etch is shown in FIG. 2c, which illustrates the good masking performance of the remaining portions of masking layers 13, 15. Masking layer 15, and the exposed portions of masking layer 13 and of masking layer 11 (at the bottom of the via), are then removed by an etch that selectively etches masking layers 13, 15 relative to insulating layers 12, 14, and conductor 10. The completed structure is shown in FIG. 2d.

As evident from FIG. 2d, the misalignment of trench opening T relative to via opening V causes a narrowing of the via through insulating layer 12. The resulting via through insulating layer 12 in FIG. 2d is evidently narrowed from the patterned via opening V, as evident by the setback of patterned masking layer 13 from this via (along the left edge of the via, in the view of FIG. 2d). This narrowing of the via, resulting from misalignment of the trench and via openings in this conventional process, can result in poor step coverage of the metal to be plated or otherwise deposited into the via, voids in this metal, and poor or open contacts to underlying structure 10.

BRIEF SUMMARY OF THE INVENTION

It is therefore an object of this invention to provide a misalignment tolerant method of fabricating dual damascene metallization in an integrated circuit structure.

It is a further object of this invention to provide such a method in which misalignment between the via and trench openings do not result in reduction of via width.

It is a further object of this invention to provide such a method in which anti-reflective coatings may be used to define the trench and via openings.

It is a further object of this invention to provide such a method in which the topography is minimized throughout the trench and via formation process.

Other objects and advantages of this invention will be apparent to those of ordinary skill in the art having reference to the following specification together with its drawings.

The present invention may be implemented into a dual damascene process, in which trenches and vias are formed into insulating material. The insulating material includes a lower interlevel portion, and an upper intermetal portion.

Etch stop layers may be disposed between the portions, as well as under the interlevel portion. A hardmask layer is disposed over the intermetal portion. In a first step, a via opening is photolithographically defined in the hardmask layer, followed by a partial formation of the via by etching the upper interlevel insulator portion to the intermediate etch stop layer, if present. The intermediate etch stop layer in the via is then removed. A trench opening is then patterned using photoresist, and an appropriate antireflective coating if needed. This trench opening is then transferred to the uppermost hard mask layer by an etch of that layer, and the anti-reflective coating and photoresist are removed. The trench is then etched through the upper intermetal insulator portion, simultaneously with the etching of the remainder of the via through the lower interlevel insulator portion. The etch of each layer stops on the corresponding etch stop layer. The hardmask and exposed etch stop layers are removed, and the metallization deposited into the trench-via combination. Following chemical mechanical polishing (CMP), the structure is then ready for the next metal level or for completion, as the case may be.

BRIEF DESCRIPTION OF THE SEVERAL VIEWS OF THE DRAWING

FIG. 3 is a plan view of a portion of an integrated circuit at a stage in its manufacture according to the preferred embodiment of the invention.

FIGS. 4a through 4j are cross-sectional views of a portion of an integrated circuit at various stages in its manufacture according to the preferred embodiment of the invention.

FIGS. 5a through 5j are cross-sectional views of another portion of the integrated circuit of FIGS. 4a through 4j, at various stages in its manufacture according to the preferred embodiment of the invention.

DETAILED DESCRIPTION OF THE INVENTION

Figure 1A:
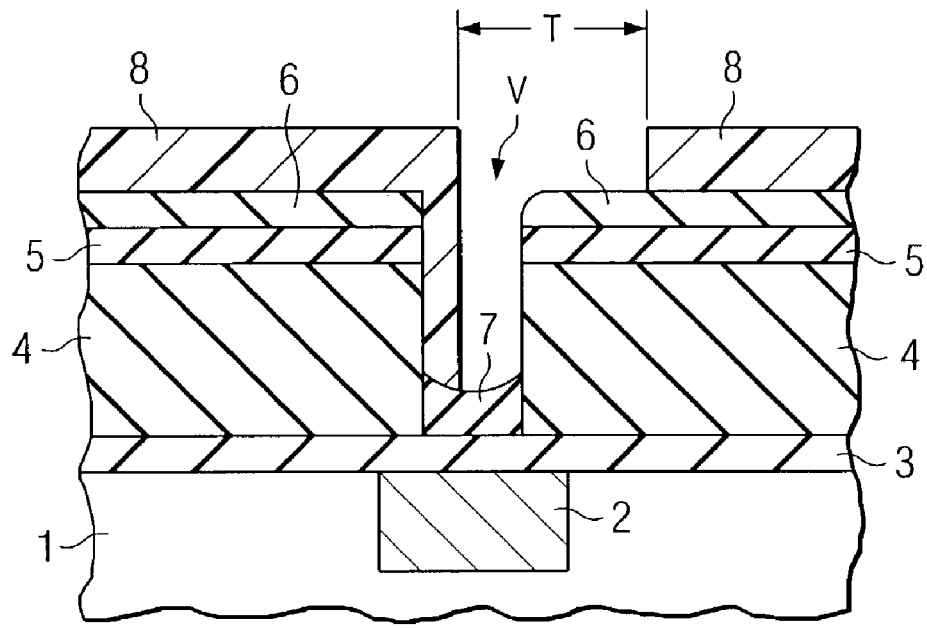
FIGS. 1a and 1b are a cross-sectional view and a plan view, respectively, of a portion of an integrated circuit at a stage in its manufacture according to a conventional process.
Figure 1B:
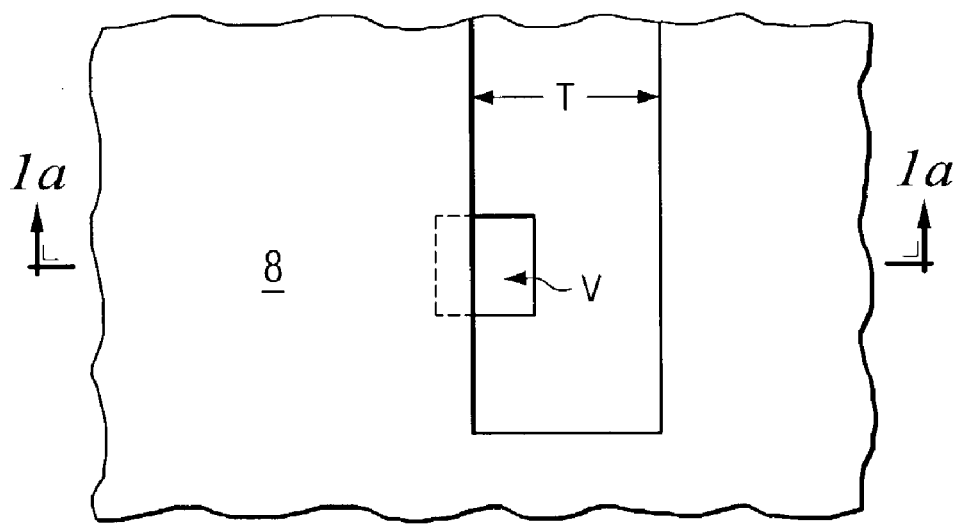
Figure 2A:
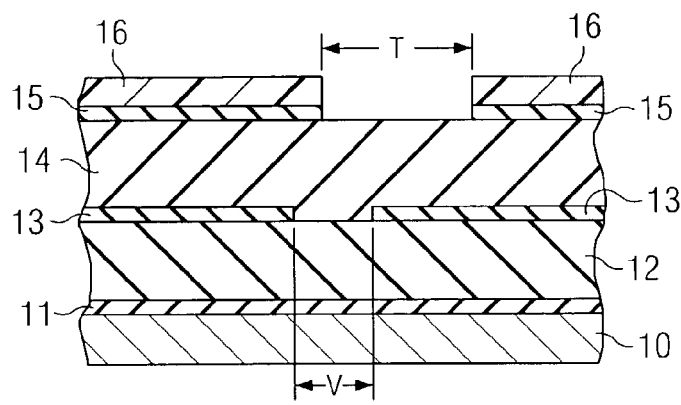
FIGS. 2a through 2d are cross-sectional views of a portion of an integrated circuit at various stages in its manufacture according to another conventional process.
Figure 2B:
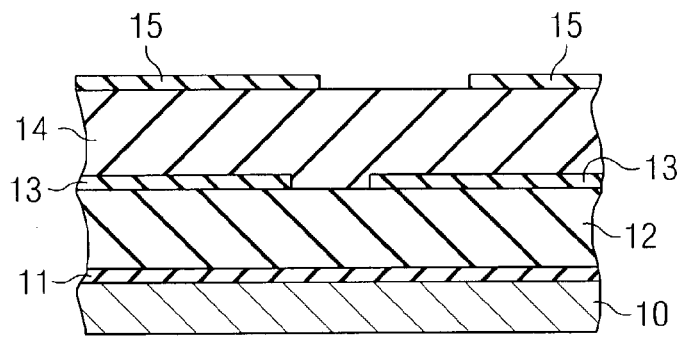
Figure 2C:
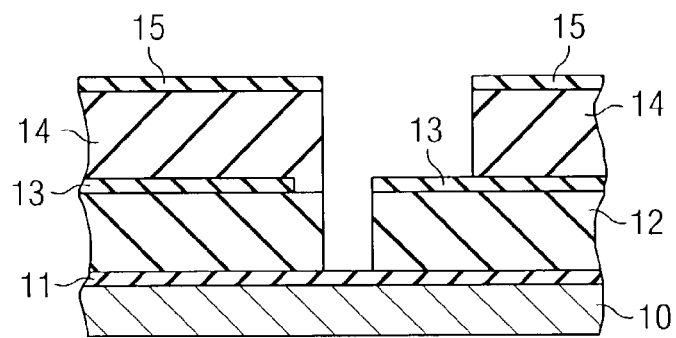
Figure 2D:
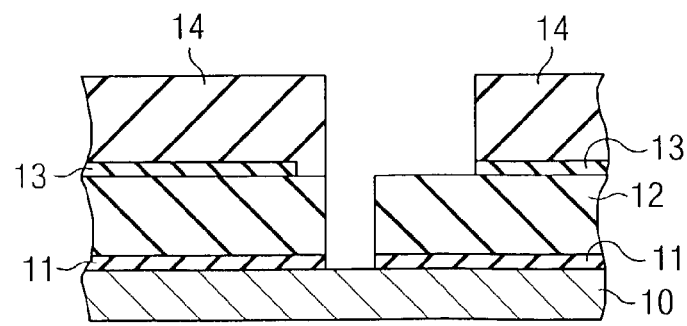

The present invention will be described in connection with the formation of multiple level metal conductors in an integrated circuit, and specifically in connection with copper metallization formed by way of a dual damascene process. As will become apparent from the following description, it is believed that this invention is especially beneficial when used in that process. However, it is also contemplated that this invention will provide benefits in many other applications in which trenches and vias are formed into an insulating layer, and at other stages of the integrated circuit manufacturing process. It is further contemplated that the specific materials and chemical reagents noted in this description are also provided by way of example only, and that other materials and reagents may be used in connection with other alternative implementations of this invention. It is therefore to be understood that this description is provided by way of example only, and is not intended to limit the scope of the invention as claimed.

The preferred embodiment of the invention will now be described in detail, with reference to FIG. 3, FIGS. 4a through 4j, and FIGS. 5a through 5j. In the plan view of FIG. 3, conductor 40 is illustrated as disposed within a trench that has been formed into intermetal dielectric layer 30. Conductor 40 also extends into via locations V1, V2, which, as will be apparent from the following description, extend through interlevel dielectric layer 26 to contact conductors 22 in prior levels. Interlevel dielectric layer 26 underlies intermetal dielectric layer 30, and overlies prior level conductors 22. In this example, conductor 40, and the trench containing conductor 40, is properly aligned relative to via location V1, while conductor 40 and its trench are misaligned, by a distance MA, relative to via location V2. This misalignment is sufficiently severe that part of via location V2 extends outside of the otherwise normal boundary of conductor 40 and its trench. As will be apparent from the following description, however, the material of conductor 40 will fill the via at via location V2, despite this misalignment. As a result, the vias at via locations V1, V2 have the same dimensions as one another, despite the illustrated misalignment.

The material of conductor 40 may be any one of a number of known materials, specifically those that are compatible with formation by damascene processes. According to the preferred embodiment of the invention, the preferred material for conductor 40 is copper, because of its excellent conductivity and robustness from an electromigration standpoint. Of course, other materials known in the integrated circuit manufacturing art may alternatively be used. In addition, the material of prior level conductors 22 is also probably of the same material as that of conductor 40, such that the process according to the preferred embodiment of the invention is particularly useful in connection with the formation of second and higher levels of metallization in the integrated circuit. Of course, conductor 22 may alternatively be formed of a different material, as appropriate for the particular implementation.

Referring now to FIGS. 4a and 5a, the manufacturing process for forming conductor 40 according to the preferred embodiment of the invention will now be described in detail. FIG. 4a is a cross-sectional view taken at via location V1, with which conductor 40 is properly aligned as shown in FIG. 3, while FIG. 5a is a cross-sectional view taken at via location V2, with which conductor 40 is misaligned, also as shown in FIG. 3. In the stage illustrated in FIGS. 4a and 5a, since no trenches (or vias) have yet been formed, these two locations are essentially identical in construction.

In each of the locations shown in FIGS. 4a and 5a, an instance of conductor 22 is disposed within insulator layer 20. Conductor 22, as mentioned above, is the element to which contact is to be made by overlying conductor 40. According to the preferred embodiment of the invention, in which conductor 40 is formed of copper, conductor 22 may also be formed of copper, for example serving as a lower level of metallization. Alternatively, particularly if conductor 40 is forming a first damascene copper level, conductor 22 may be formed of another metal or conductive material, such as tungsten; however, it is contemplated that this embodiment of the invention will more typically be useful in second and higher levels of metallization. Insulator layer 20 is formed of a dielectric material, such as silicon dioxide, which serves to insulate conductor 22 from other instances of itself, and from other conductive or semiconductor elements (not shown) which underlie insulator layer 20. Alternatively, insulating layer 20 may be a low dielectric constant insulator, such as fluorine-doped silicon dioxide (also referred to as fluorinated silicate glass, or FSG), organosilicate glass (OSG), and other such materials. It is contemplated that transistors, passive devices, and the like are in place beneath insulating layer 20, as conventional for integrated circuits. These active and passive devices are formed at a semiconducting surface of a substrate (not shown), as fundamental in the art, with the substrate providing support for the structures being formed according to this preferred embodiment of the invention, in the conventional manner. Conductors 22 are in contact with such other active and passive devices and elements underlying insulating layer 20, and as such form part of an overall integrated circuit being formed at this surface of the substrate.

Via etch stop layer 24 overlies insulating layer 20 and conductor 22. Via etch stop layer 24 is a relatively thin layer of a material having different etch characteristics than that of overlying interlevel dielectric layer 26. As such, the thickness and composition of via etch stop layer 24 will depend upon the composition of interlevel dielectric layer 26. Interlevel dielectric layer 26, as indicated by its name, is primarily responsible for insulating conductors in adjacent levels from one another, thus providing isolation between such conductors in the vertical sense. In the example of FIGS. 4*a* and 5*a*, interlevel dielectric layer 26 insulates conductors 22 from conductors 40, at locations away where these conductors 22, 40 cross one another, other than at vias, of course. The material of interlevel dielectric layer 26 may be a low dielectric constant ("low-k") material if desired, or alternatively may be doped or undoped silicon dioxide. Preferred materials for interlevel dielectric layer 26 include fluorosilicate glass (FSG) and organosilicate glasses (OSG), in which case via etch stop layer 24 is preferably a material such as silicon nitride or silicon carbide. It will become apparent from this description that, in any case, via etch stop layer 24 must be an insulator, so that conductors 22 do not short to one another.

Trench etch stop layer 28 is disposed over interlevel dielectric layer 26, and intermetal dielectric layer 30 is disposed over trench etch stop layer 28. Intermetal dielectric layer 30 is intended primarily to insulate adjacent conductors 40 within the same level from one another, effectively in the horizontal direction. As before, the thickness and composition of trench etch stop layer 28 will depend upon the composition of intermetal dielectric layer 30, considering that the function of trench etch stop layer 28 is to resist etching by the etchant used to etch intermetal dielectric layer 30. As will become apparent from the following description, intermetal dielectric layer 30 and interlevel dielectric layer 26 will be etched simultaneously, and as such intermetal dielectric layer 30 is preferably formed of the same material as interlevel dielectric layer 26, and preferably to approximately the same thickness. As such, preferred materials for intermetal dielectric layer 30 include FSG and OSG, and preferred materials for trench etch stop layer 28 are insulating materials such as silicon carbide and silicon nitride.

Alternatively, interlevel dielectric layer 26 and intermetal dielectric layer 30 can be fabricated from different materials, with different etch characteristics and etch rates. In this case, trench etch stop layer 28 can be omitted. If different materials are used for these layers 26, 30, the layer thicknesses are preferably adjusted so that the etch of intermetal dielectric layer 30 and interlevel dielectric layer 26 form the trench and complete the via at approximately the same time. For example, if interlevel dielectric layer 26 is etched at one-half the rate as intermetal dielectric layer 30, the thickness of interlevel dielectric layer 26 can be set to one-half that of intermetal dielectric 30, so that the trench etch is completed approximately at the same time as the etch of the lower portion of the via is completed.

As shown in each of FIGS. 4*a* and 5*a*, hardmask layer 32 is disposed over intermetal dielectric layer 30. As will become apparent from the following description, hardmask layer 32 will be used to define the location of trenches to be formed in intermetal dielectric layer 30, and as such is preferably of a material that is resistant to etches of the materials of intermetal dielectric layer 30 and interlevel dielectric layer 26. Hardmask layer 32 may be somewhat thicker than etch stop layers 24, 28, if desired, and may also be formed of a conductive material (because it can be stripped after the processing described herein, if desired). In addition, if hardmask layer 32 is selected of a material that is anti-reflective to the wavelengths of light used in subsequent photolithography, the deposition and processing of an anti-reflective layer may be omitted, saving additional manufacturing cost. Examples of preferred materials for hardmask layer 32 include silicon nitride, silicon carbide, tantalum nitride, and titanium nitride.

The particular deposition techniques used to form via etch stop layer 24, interlevel dielectric layer 26, trench etch stop layer 28, intermetal dielectric layer 30, and hardmask layer 32, will of course depend upon the particular materials used for each of these layers. In each case, conventional deposition techniques, such as chemical vapor deposition, spin-on techniques, and the like are suitable for deposition of these layers, as appropriate for the specific materials. Planarization processes, such as chemical mechanical polishing (CMP), may also be performed to planarize the surface of the structure, if desired. For example, CMP may be applied after the deposition of intermetal dielectric layer 30, prior to the deposition of hardmask layer 32, if desired. Of course, according to this embodiment of the invention in which conductors 22 are flush with the surface of surrounding insulator 20, very little topography is present, and thus CMP may not be necessary.

The thicknesses of the various layers shown in FIGS. 4*a* and 5*a* will depend upon the particular process technology being used, and also upon the composition of the various materials in the particular implementation. By way of example, intermetal dielectric layer 30 and interlevel dielectric layer 26, both formed of OSG, may be on the order of 5000 Å thick; in this example, via etch stop layer 24 and trench etch stop layer 28, both formed of silicon carbide will be on the order of 600 Å thick, and hardmask layer 32 formed of silicon carbide will be on the order of 2000 Å thick.

According to the preferred embodiment of the invention, photoresist 34 is applied to the surface of hardmask layer 32. A bottom anti-reflective coating (not shown) may be applied under photoresist 34, if such would be useful at this stage in the process to eliminate standing wave effects, and the effects of reflective notching and thin film interference, and the like, in the exposure of photoresist 34. Photoresist 34 is then photolithographically patterned, by conventional masked exposure and developing, to define the locations at which vias V1, V2 are to be formed. FIGS. 4*b* and 5*b* illustrate the structures at this stage of manufacture, in which photoresist 34 exposes underlying hardmask layer 32 at via locations V1, V2. In this example, via locations V1, V2 are properly aligned with the location of underlying conductors 22, although some misalignment tolerance is provided by this invention because the eventual vias may be positioned over the edges of conductors 22 and still provide adequate electrical conduction.

Figure 4C:
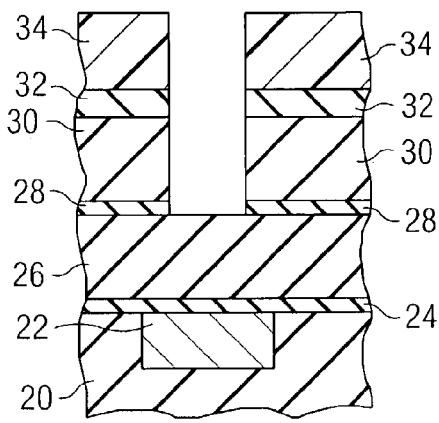
Figure 5C:
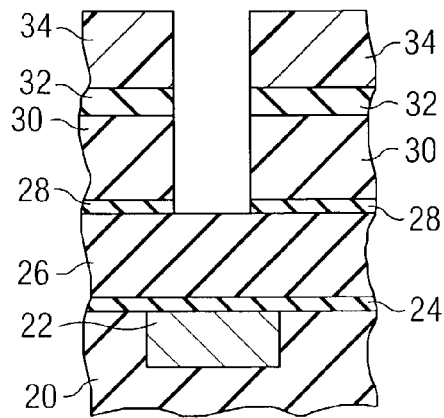

Using patterned photoresist 34 as a mask, hardmask layer 32, intermetal dielectric layer 30, and trench etch stop 28 are then etched at via locations V1, V2, resulting in the structure illustrated in FIGS. 4*c* and 5*c*. This etch operation may require multiple steps and chemistries to carry out, considering the different materials that are etched at this time. However, because via locations V1, V2 are typically of minimum or near-minimum width, this etch operation should be an anisotropic plasma etch so that the resulting sidewalls are substantially vertical. For the example of hardmask layer 32 and trench etch stop layer 28 of silicon carbide and intermetal dielectric layer 30 of OSG, an exemplary etch is a plasma etch with species $C_4F_8$, $N_2$, and Ar. As shown in FIGS. 4c and 5c, the pattern of via locations V1, V2 has now been transferred to hardmask layer 32, as well as to trench etch stop layer 28. This etch is referred to as a "half-via" or "partial-via" etch, because the via pattern is etched only partially (or halfway) through the combination of insulator layers 26, 28, and not fully through to conductor 22 at this stage of the process.

Figure 4D:
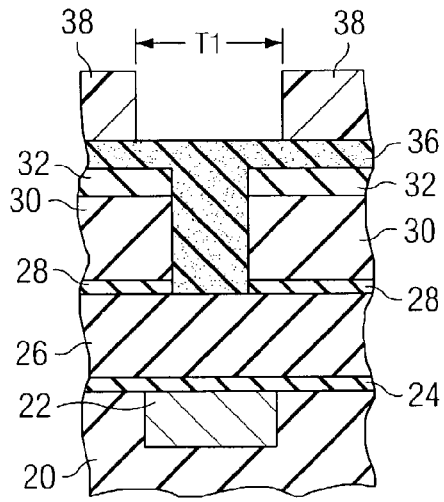
Figure 5D:
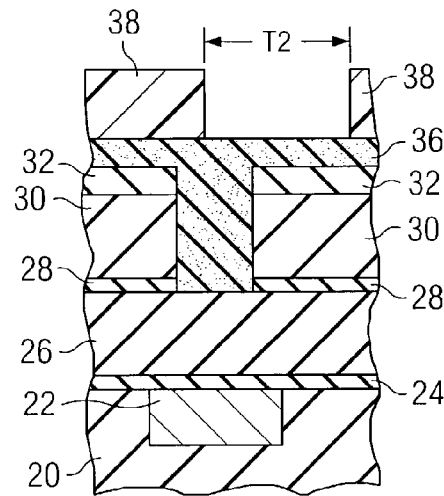

Referring now to FIGS. 4d and 5d, the definition of trench locations T1, T2 will now be described. According to the preferred embodiment of the invention, bottom anti-reflective coating (BARC) layer 36 overlies hardmask layer 32, and extends into the etched portions of intermetal dielectric layer 30 and trench etch stop layer 28. As known in the art, BARC layer 36 assists photolithography by reducing undesired effects such as reflective notching, standing wave effects, and large swing ratio due to thin film interference, all such effects due to reflection of the photolithographic light from the surfaces of hardmask layer 32, interlevel dielectric layer 26, and other structures. Alternatively, as noted above, if hardmask layer 32 is itself sufficiently antireflective, BARC layer 36 may be omitted. In either case, photoresist 38 is deposited overall, and exposed and developed to define trench locations T1, T2 as shown in FIGS. 4d and 5d, respectively. The widths of trench locations T1, T2 are preferably at least as wide as that of corresponding via locations V1, V2. In this example, trench location T1 of FIG. 4d is properly aligned relative to the previously defined via location (V1), while trench location T2 of FIG. 5d is misaligned (in this case shifted to the right) relative to its corresponding previously defined via location (V2). According to this preferred embodiment of the invention, as will become apparent from the following description, this misalignment is well tolerated in this dual damascene process.

In this example, however, because the half-via etch has only partially formed the eventual vias, the depth of the vias at this time is relatively shallow. This permits the use of BARC layer 36 in the manner shown in FIGS. 4d and 5d, because BARC layer 36 can fill the half-vias that are etched. Accordingly, this process attains the advantages of BARC layer 36 in the exposure of photoresist 38, without adding additional photolithography errors as in conventional full via-first processes, such as shown in FIG. 1a, such errors due to the incomplete fill of vias with BARC and photoresist and to the significant topography presented by the full via etch. In addition, thinning of photoresist 38 at the surface is much reduced according to this embodiment of the invention, due to the improved planarity of the structure.

Figure 4E:
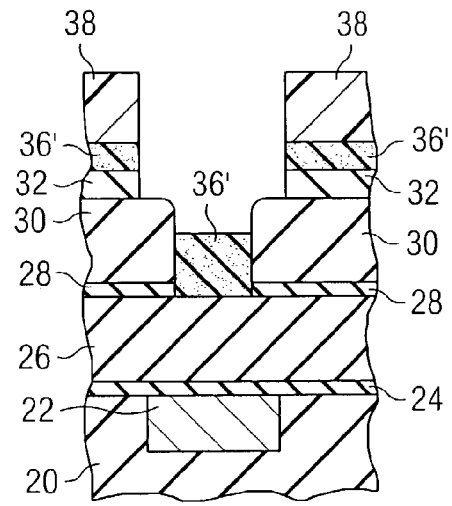
Figure 5E:
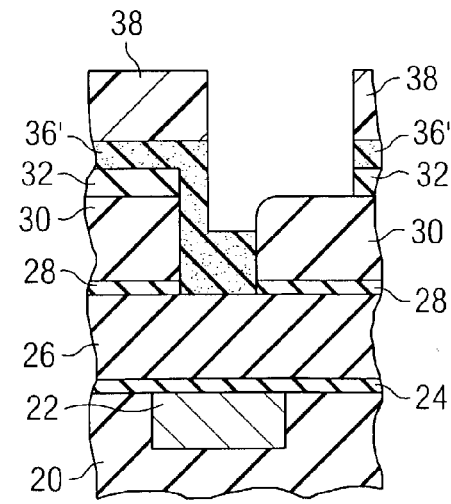
Figure 4F:
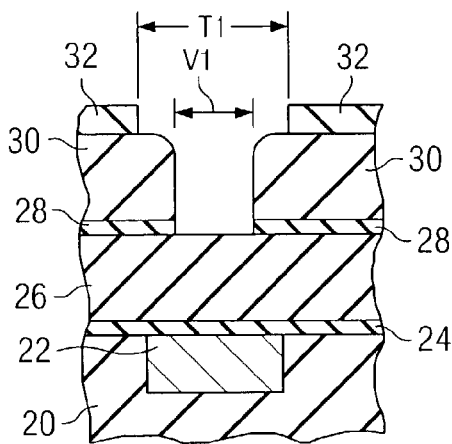
Figure 5F:
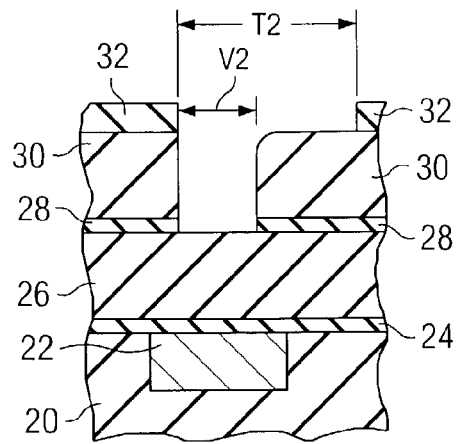

Following the definition of trench locations, T1, T2, hardmask layer 32 is etched at locations defined by the masking portions of photoresist 38. The etchant and process will, of course, depend upon the particular material used to form hardmask layer 32. Examples of the etchant species used to etch hardmask layer 32 include $CF_4$ and $CH_2F_2$. At the locations exposed by photoresist 38, BARC layer 36 is removed, at least partially. The resulting structures are shown in FIGS. 4e and 5e. BARC layer remainders 36' remain in the half-vias etched into intermetal dielectric layer 30, as shown in FIGS. 4e and 5e. In the misaligned case of FIG. 5e, BARC layer reminder 36' is contiguous with material underlying photoresist 38. In any event, the pattern of trench locations T1, T2 has now been transferred to hardmask layer 32, as shown in each of FIGS. 4e and 5e. Masking photoresist 38 and BARC layer remainders 36' are then removed, by conventional plasma ashing or wet strips, as known in the art. The resulting structures are illustrated in FIGS. 4f and 5f. As evident from FIG. 5f, even in situations of significant misalignment between trench location T2 and via location V2, the width of via location V2 remains the same as the width of via location V1 (FIG. 4f). This is because of the previously performed half-via etch, and the retention of the via pattern by trench etch stop layer 28. One can notice from FIGS. 4f and 5f, however, that the width of trench location T2 is wider than that of trench location T1, because trench location T2 widens out to the edge of via location V2 at this misaligned location.

Figure 4G:
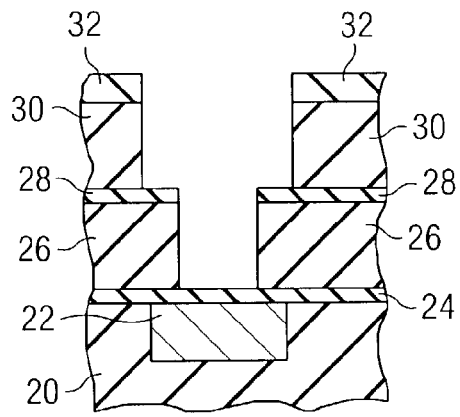
Figure 5G:
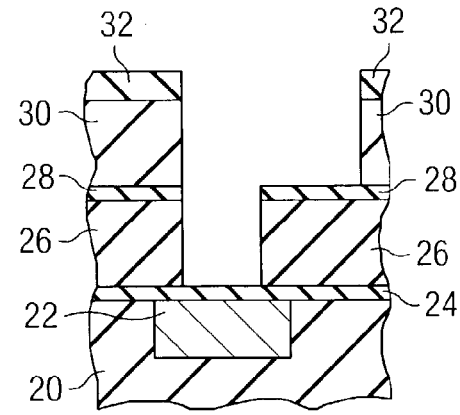

According to the preferred embodiment of the invention, intermetal dielectric layer 30 and interlevel dielectric layer 26 are then simultaneously etched, using hardmask layer 32 as a mask to define the trenches through intermetal dielectric layer 30, and using the sidewalls of the half-via through intermetal dielectric layer 30 to define the width of the vias through interlevel dielectric layer 26. To the extent that the simultaneous trench and via etch is not perfectly anisotropic, these sidewalls will pull back during the etch, but trench etch stop layer 28 will help to maintain the dimensions of the lower portion of the via. This etch stops upon intermetal dielectric layer 30 being etched through to trench etch stop layer 28, with the portions of interlevel dielectric layer 26 beneath trench etch stop layer 28 are protected from the etch. Similarly, the etch of the remainder of the via through interlevel dielectric layer 26 stops on via etch stop layer 24. The resulting structures are shown in FIGS. 4g and 5g. According to this preferred embodiment of the invention, this combined trench and lower via etch is preferably a substantially anisotropic plasma etch, with the etchant species selected so as to selective etch dielectric layers 26, 30 relative to etch stop layers 24, 28. For insulating layers 26, 30 of OSG and etch stop layers 24, 28 of silicon carbide, plasma etches using $C_4F_8$, $N_2$, and argon are preferred. The etch is preferably extended past the endpoint of dielectric layers 26, 30 clearing, to compensate for variations in dielectric thickness and local etch rates.

Figure 4H:
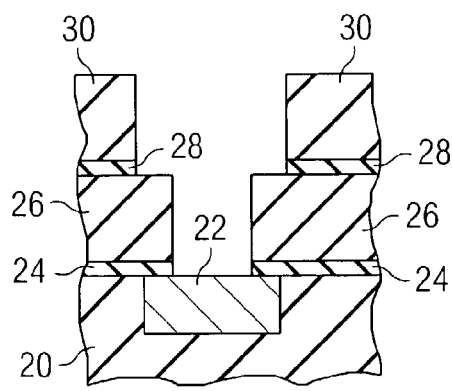
Figure 5H:
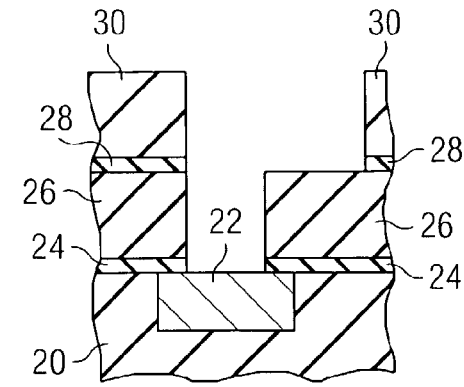

Once the trenches and vias have been formed, the remaining exposed portions of via etch stop layer 24 are removed, by a conventional plasma or wet etch, to expose conductors 22 at the bottom of the via. Hardmask layer 32 (especially if formed of a conductive or semi-conductive material) and exposed portions of trench etch stop layer 28 are also preferably removed by this cleanup. Alternatively, hardmask layer 32 can be removed during copper CMP (described below), or left in place to protect intermetal dielectric 30 if hardmask layer 32 is non-conductive. The resulting structure is illustrated in FIGS. 4h and 5h.

Figure 4I:
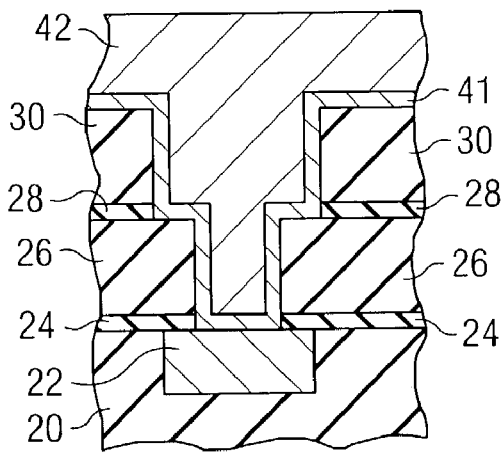
Figure 5I:
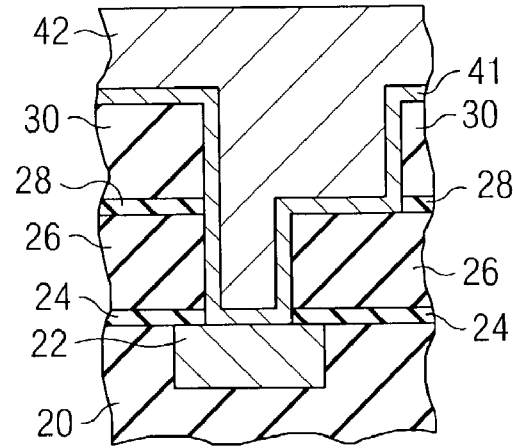

According to the preferred embodiment of the invention, metallization layer 42 is now deposited into the trenches and vias, as shown in FIGS. 4i and 5i. As mentioned above, metallization layer 42 is preferably copper, although other metal systems may alternatively be used. For the example of copper, the deposition of metallization layer 42 is preferably performed by electroplating. Typically, as known in the art, the overall copper electroplating process includes the chemical vapor deposition of a liner or barrier layer 41 followed by the deposition of a seed layer of the copper metal. Electroplating of copper is then performed, by way of which copper atoms adhere to the copper seed layer to form metallization layer 42. Variations and alternatives to the copper deposition processes are well known in the art, and may be used to deposit metallization 42 according to this preferred embodiment of the invention.

Figure 4J:
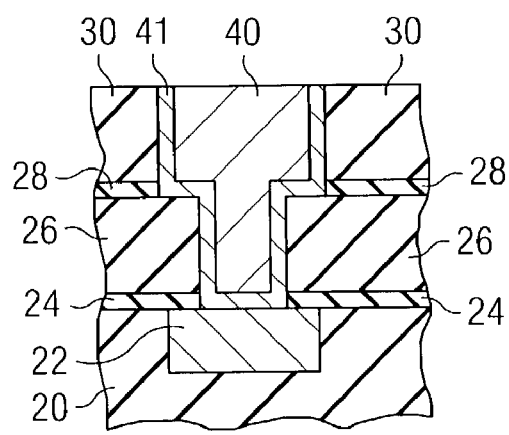
Figure 5J:
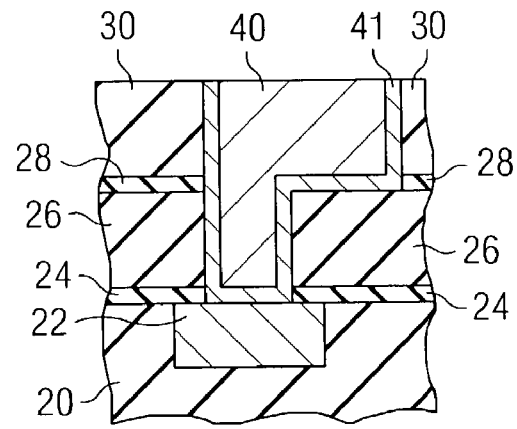

As shown in FIGS. 4i and 5i, the deposition of copper continues until metallization layer 42 is sufficiently thick to fill the trenches and vias, and to overlie intermetal dielectric layer 30 to a desired thickness. To complete the damascene process, planarization of the structure is then performed to form conductors 40 to be flush with the surface of intermetal dielectric layer 30. A preferred planarization process is chemical mechanical polishing (CMP), which removes the portion of barrier layer 41 and metallization layer 42 overlying intermetal dielectric layer 30, and also removes a portion of intermetal dielectric layer 30 itself to ensure that shorting filaments of metallization layer 42 do not remain. The resulting conductors 40 are thus formed within trenches and vias in the structure, as shown in FIGS. 4j and 5j.

This process of forming conductors 40 as described relative to FIGS. 4a through 4j and FIGS. 5a through 5j correspond to the formation of one level of metallization. This process can now be repeated for each of several more levels of metallization, with the patterns of the vias and trenches corresponding to the locations of contacts and conductors, respectively, desired in each such level to form the designed integrated circuit. For example, many modern integrated manufacturing flows include as many as eight levels of metallization. The process according to the preferred embodiment of the invention is suitable for use in each of these metallization levels.

This invention provides several important advantages in the fabrication of integrated circuits, as has been mentioned above. To summarize, this invention provides the manufacturing process with significant tolerance to misalignment between trenches and underlying vias in a given level. Even with significant misalignment of the overlying trenches, the width of the underlying via is not degraded, and thus full conductivity to the underlying conductors is maintained in the event of such misalignment. In addition, this invention permits the use of a BARC layer in the definition of the trench pattern, because the BARC layer is applied with only a portion of the via having been etched. A minimum amount of topography is also present for both the via and trench photolithography operations, further improving the ability to form these features to very small dimensions.

While the present invention has been described according to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a metal conductor in an integrated circuit, comprising the steps of:
    forming a via etch stop layer over a first conductor;
    forming an interlevel dielectric layer over the via etch stop layer;
    forming an intermetal dielectric layer over the interlevel dielectric layer;
    forming a hardmask layer over the intermetal dielectric layer;
    then etching through the hardmask layer and the intermetal dielectric layer at a via location;
    then, defining a trench location with a trench mask layer, the trench location overlapping at least partially over the etched portion of the intermetal dielectric layer, wherein the step of defining a trench location with a trench mask layer comprises:
        forming a masking layer comprised of photoresist over the hardmask layer;
        patterning the masking layer over the hardmask layer, to define the trench location;
        etching the hardmask layer at the trench location, using the patterned masking layer as a mask; and
        removing the patterned masking layer;
    then simultaneously etching through the intermetal dielectric layer at the trench location and through the interlevel dielectric layer at the via location, the etching at the via location effectively stopping at the via etch stop layer, the simultaneous etching forming a trench in the intermetal dielectric layer at the trench location that is contiguous with a via through the interlevel dielectric layer at the via location;
    removing the via etch stop layer at the via location; and
    then forming a second conductor within the trench and via, in contact with the first conductor.

2. The method of claim 1, further comprising:
    forming a trench etch stop layer over the interlevel dielectric layer;
    wherein the step of forming the intermetal dielectric layer forms is performed after the step of forming the trench etch stop layer;
    wherein the step of etching through the intermetal dielectric layer also etches through the trench etch stop layer;
    and wherein the step of simultaneously etching through the intermetal dielectric layer at the trench location and through the interlevel dielectric layer at the via location also, at the trench location, effectively stops at the trench etch stop layer.

3. The method of claim 1, further comprising etching the hardmask layer to define the via location.

4. The method of claim 1, wherein the step of forming the masking layer comprises:
    forming a bottom antireflective coating layer over the etched hardmask layer;
    forming a photoresist layer over the bottom antireflective coating layer;
    patterning the photoresist layer to remove a portion thereof at the trench location, leaving the remainder of the patterned photoresist layer as the patterned masking layer.

5. The method of claim 4, wherein the step of removing the patterned masking layer removes both the patterned photoresist layer and remaining portions of the bottom antireflective coating layer.

6. The method of claim 1, wherein the intermetal dielectric layer and interlevel dielectric layer are comprised of different materials from one another.

7. The method of claim 1, wherein the intermetal dielectric layer and interlevel dielectric layer are comprised of the same material as one another.

8. The method of claim 1, wherein the second conductor comprises copper.

9. The method of claim 8, wherein the step of forming a second conductor comprises:
    electroplating a layer of metal, comprising copper, the layer of metal extending into the trench and via and overlying the intermetal dielectric layer; and
    planarizing the layer of metal to remove portions overlying the intermetal dielectric layer.

10. The method of claim 9, wherein the planarizing step is performed by chemical mechanical polishing.

11. The method of claim 1, further comprising:

forming a via etch stop layer over the second conductor;

forming an interlevel dielectric layer over the via etch stop layer;

forming a intermetal dielectric layer over the interlevel dielectric layer;

then etching through the intermetal dielectric layer at a via location;

defining a trench location with a trench mask layer, the trench location overlapping at least partially over the etched portion of the intermetal dielectric layer;

then simultaneously etching through the intermetal dielectric layer at the trench location and through the interlevel dielectric layer at the via location, the etching at the via location effectively stopping at the via etch stop layer, the simultaneous etching forming a trench in the intermetal dielectric layer at the trench location that is contiguous with a via through the interlevel dielectric layer at the via location;

removing the via etch stop layer at the via location; and then forming a third conductor within the trench and via, in contact with a portion of the second conductor.

* * * * *